United States Patent [19]

Davis et al.

[11] Patent Number: 4,966,519

[45] Date of Patent: Oct. 30, 1990

[54] INTEGRATED CIRCUIT PROCESSING SYSTEM

[75] Inventors: Cecil J. Davis, Greenville; Robert Matthews, Plano; Robert A. Bowling, Garland, all of Tex.

[73] Assignee: Texas Instruments Incorporated, Dallas, Tex.

[21] Appl. No.: 114,812

[22] Filed: Oct. 29, 1987

Related U.S. Application Data

[60] Division of Ser. No. 61,017, Jun. 12, 1987, abandoned, which is a continuation of Ser. No. 824,342, Jan. 30, 1986, abandoned, which is a continuation-in-part of Ser. No. 790,708, Oct. 24, 1985, abandoned, Ser. No. 790,918, Oct. 24, 1985, abandoned, and Ser. No. 790,924, Oct. 24, 1985, Pat. No. 4,687,542.

[51] Int. Cl.$^5$ .............................................. B65G 49/05
[52] U.S. Cl. .................................... 414/786; 118/719; 118/500; 414/217; 414/416; 414/222; 414/744.8; 414/331
[58] Field of Search ............... 414/217, 416, 609, 610, 414/403, 404, 220, 225, 222, 786, 282, 728, 331, 744.2, 744.8; 118/728, 729, 733, 50, 50.1, 500, 719; 73/864.91; 250/288

[56] References Cited

U.S. PATENT DOCUMENTS

| | | | |
|---|---|---|---|
| 4,047,624 | 9/1977 | Dorenbos | 414/217 |
| 4,178,113 | 12/1979 | Beaver, II et al. | 414/416 X |
| 4,338,883 | 2/1982 | Mahler | 118/729 X |
| 4,483,651 | 11/1984 | Nakane et al. | 414/217 |
| 4,532,816 | 8/1985 | Miller | 414/217 X |
| 4,546,897 | 10/1985 | Maloy et al. | 414/217 X |
| 4,584,045 | 4/1986 | Richards | 414/222 X |
| 4,604,020 | 8/1986 | Toro Lira et al. | 414/217 |
| 4,605,469 | 8/1986 | Shih et al. | 414/217 X |
| 4,616,683 | 10/1986 | Tullis et al. | 414/217 X |
| 4,632,624 | 12/1986 | Mirkovich et al. | 118/500 |
| 4,636,128 | 1/1987 | Millis et al. | 414/217 |
| 4,664,578 | 5/1987 | Kakehi | 414/217 |
| 4,668,484 | 5/1987 | Elliott | 414/217 X |
| 4,682,927 | 7/1987 | Southworth et al. | 414/217 |

Primary Examiner—Frank E. Werner
Attorney, Agent, or Firm—B. Peter Barndt; James T. Comfort; Melvin Sharp

[57] ABSTRACT

A vacuum-tight wafer carrier, and a load lock suitable for use with this wafer carrier. The wafers are supported at each side by a slightly sloping shelf, so that minimal contact (line contact) is made between the wafer surface and the surface of the shelf. This reduces generation of particulates by abrasion of the surface of the wafer. The carrier also contains elastic elements to restrain the wafers from rattling around, which further reduces the internal generation of particulates. When the wafer carrier is placed into the load lock, its body is lowered from beneath its cover through an aperture into a lower chamber, where wafers are loaded and unloaded under vacuum; the carrier cover remains covering the aperture into the lower chamber, so that the wafers never see any surface which is directly exposed to atmosphere. A wafer transport arm mechanism permits interchange of wafers among one or more processing stations and one or more load locks of this type.

46 Claims, 9 Drawing Sheets

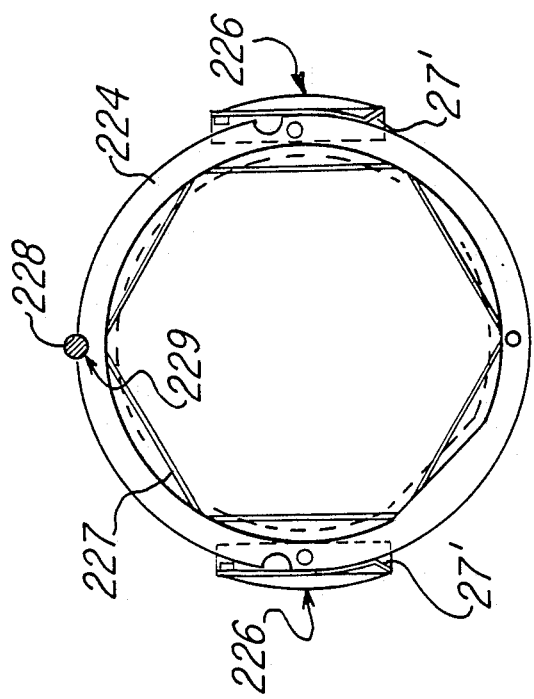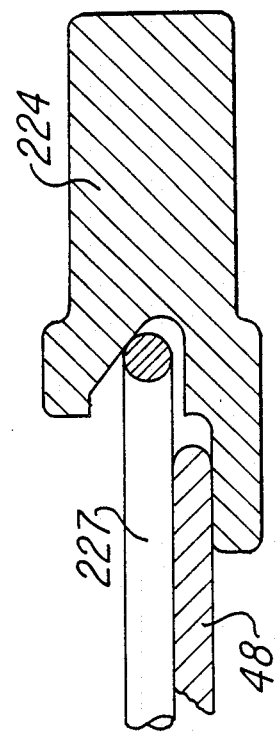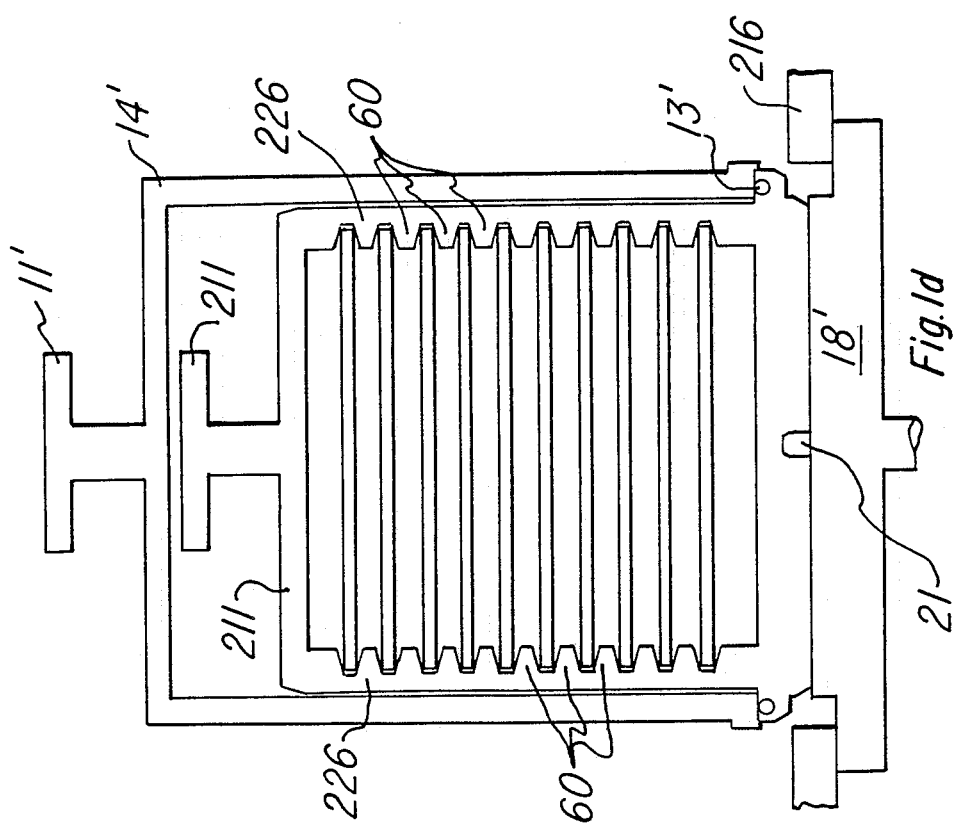

INTEGRATED CIRCUIT PROCESSING SYSTEM

CROSS-REFERENCE TO RELATED APPLICATIONS

This patent application is a divisional of Ser. No. 061,017, filed June 12, 1987, now abandoned; which is a continuation of Ser. No. 824,342, filed Jan. 30, 1986 (now abandoned); which is a continuation-in-part of: Ser. No. 790,708, filed Oct. 24, 1985, now abandoned; Ser. No. 790,918, filed Oct. 24, 1985, now abandoned; and Ser. No. 790,924, filed Oct. 24, 1985, now U.S. Pat. No. 4,687,542.

BACKGROUND AND SUMMARY OF THE INVENTION

The present invention relates to apparatus for manufacturing of integrated circuits.

One of the basic problems in integrated circuit manufacturing is particulates. This problem is becoming more and more difficult, because of two trends in integrated circuit processing: First, as device dimensions become smaller and smaller, it is necessary to avoid the presence of smaller and smaller particles. This makes the job of making sure that a clean room is really clean increasingly difficult. For example, a clean room which is of class 1 (has one particle per cubic foot) for particles of one micron and larger may well be class 1000 or worse if particle sizes down to 100 angstroms are counted.

Second, there is increased desire to use large size integrated circuit patterns: for example, integrated circuit sizes larger than 50,000 square mils are much more commonly used now than they were five years ago.

Thus, particulates are not only an extremely important source of loss in integrated circuit manufacturing, but their importance will increase very rapidly in the coming years. Thus, it is an object of the present invention to provide generally applicable methods for fabricating integrated circuits which reduce the sensitivity of the process to particulate contamination.

One of the major sources of particulate contamination is human-generated, including both the particles which are released by human bodies and the particles which are stirred up by equipment operators moving around inside a semiconductor processing facility (front end). To reduce this, a general trend in the industry for several years has been to make more use of automatic transfer operations, wherein a technician can, for example, place a cassette of wafers into a machine, and then the machine automatically transfers the wafers, one by one, from the cassette through the machine (to effect the processing steps necessary) and back to the cassette, without the technician's having to touch the wafers.

However, the efforts in this direction have served to highlight the importance of a second crucial source of particuates, which is particulates generated internally by the wafers and/or transfer mechanism. That is, when the surface of the wafer jostles slightly against any other hard surface, some particulates (of silicon, silicon dioxide, or other materials) are likely to be released. The density of particulates inside a conventional wafer carrier is typically quite high, due to this source of particulates. Moreover, many of the prior art mechanisms for wafer transport will themselves generate substantial quantities of particulates.

The present invention advantageously solves this problem, by providing a wafer carrier wherein particulate generation during transport is reduced in several ways. First, the door of the vacuum carrier contains elastic elements to press the wafers lightly against the back of the carrier box. Thus, when the door of the box is closed, the wafers are restrained from rattling around, which reduces the internal generation of particulates. Second, the wafers are supported at each side by a slightly sloping shelf, so that minimal contact (line contact) is made between the wafer surface and the surface of the shelf. This reduces generation of particulates by abrasion of the surface of the wafer.

The present invention not only reduces generation of particulates in the carrier during transport and storage, but also advantageously reduces transport of particulates to the wafer face during transport and storage, by carrying the wafers face down, under a high vacuum. The prior art is not know to address this problem at all.

This wafer carrier design permits use with a wafer transport mechanism according to the present invention (and also disclosed in parent applications as filed) to provide a complete low-particulate wafer transport system.

The current state of the art wafer loading mechanisms used in the semiconductor industry consist primarily of three basic types: belt driven wafer transport, air track driven wafer transport, and arm driven wafer transport (using either vacuum coupling or nesting to hold the bottom or the edge of the wafer). However, all of these types of systems typically use face up wafer movement into and out of the carrier, vertical movement of the wafer carrier during the loading and unloading operations, wafer transfer under pressures ranging from atmospheric to low vacuum, and a requirement that wafers be unloaded in the reverse order of loading. The prior art methods accordingly have a number of important disadvantages, as follows:

First, wafers which are transported face up are more likely to catch particles generated by particle generation mechanisms inside the wafer carrier or inside the wafer loader unit.

Second, vertical movement of the wafer carrier during the loading and unloading operation creates many particles, due to rattling of the wafers in the carrier. These particles can fall directly onto the active face of adjacent wafers resting face up in the carrier.

Third, belt mechanisms will typically scrub the bottom of the wafer during loading and unloading operations, again creating many particulates due to abrasion.

Fourth, air track transport will stir many particulates around by air currents, and many of these particulates can come to rest on the active face of the wafer.

Fifth, the drive mechanisms of many loader modules are housed within the same area as the open wafer carrier will be, in close proximity to the wafers being processed. This has great potential for gross amounts of contamination.

Sixth, the mass of the carrier wafer combination changes as the wafers are loaded and unloaded, and this can affect the reliability and positioning of the wafer carrier vertical drive, particularly where large wafers (such as 150 millimeters or larger) are being handled.

Seventh, two loading modules are typically used for each processing station, so that one cassette is typically progressively loaded, and the wafers from this cassette which have been processed are loaded into a second cassette.

Eighth, loss of equipment utilization efficiency occurs every time a new cassette of wafers is loaded into or out of each processing station, since the machine must be idled while the cassette is removed.

The present invention provides advantageous solutions to all of the above problems, and achieves greatly improved low particulate wafer handling and loading operations.

One key advantage of the present invention is that wafers can be transported, loaded and unloaded without ever seeing atmospheric or even low vacuum conditions. This is extremely useful, because, at pressures of less than about $10^{-5}$ Torr, there will not be enough Brownian motion to support particulates of sizes larger than about 10 nm, and these particulates will fall out of this low-pressure atmosphere relatively rapidly.

FIG. 2 shows the time required for particles of different sizes to fall one meter under atmospheric pressure. Note that, at a pressure of $10^{-5}$ Torr or less, even 10 nm particles will fall one meter per second, and larger particles will fall faster. (Large particles will simply fall ballistically, at the acceleration of gravity.) Thus, an atmosphere with a pressure below $10^{-5}$ Torr means that particles ten nanometers or larger can only be transported ballistically, and are not likely to be transported onto the critical wafer surface by random air currents or Brownian drift.

The relevance of this curve to the present invention is that the present invention is the first to provide a way to transport wafers from one processing station to another, including loading and unloading steps, without ever exposing them to higher pressures than $10^{-5}$ Torr. This means that the wafers are NEVER exposed to airborne particulates, from the time they are loaded into the first vacuum processing station (which might well be a scrubbing and pumpdown station) until the time when processing has been completed, except where the processing step itself requires higher pressures (e.g. in conventional photolithography stations or for wet processing steps). This means that the total possibilities for particulate collection on the wafers are vastly reduced.

A key element of this advantage is that the present invention provides a method and apparatus for loading and unloading a vacuum carrier under hard vacuum.

The present invention provides a load lock which includes an apparatus for opening a vacuum wafer carrier under vacuum, for removing wafers from the carrier in whatever random-access order is desired, and for passing the wafers one by one through a port into an adjacent processing chamber, such as a plasma etch chamber. Moreover, the load lock of the present invention is able to close and reseal the wafer carrier, so that the load lock itself can be brought up to atmospheric pressure and the wafer carrier removed, without ever breaking the vacuum in the wafer carrier.

A particular advantage of the preferred embodiments of the present invention is that the mechanical apparatus preferably used for wafer transfer is extremely compact. That is, by providing a transfer arm pivoted on an arm support, with gearing or a chain drive inside the arm support so that the rotation of the arm support causes twice as much rotation of the transfer arm with respect to the arm support, a compact apparatus is provided which can rest in the home position and require no more clearance than the length of the arm support in one direction, but can be extended, by a simple rotary shaft motion, out to the length of the arm support plus the length of the transfer arm in either of two directions.

A further advantage of the preferred embodiments of the present invention is that the motors used to extend the transfer arm and to change its elevation are both held inside an exhaust manifold, so that particles generated by these moving mechanical elements do not tend to reach the interior of the load lock chamber where wafers are exposed.

A further advantage of the invention is that a transfer arm is provided which can handle wafers face down with minimal damage to device areas caused by contact with the transfer arm.

A further advantage of the present invention is that the present invention provides a wafer transfer apparatus which can handle wafers with minimum generation of particulates caused by the handling operation.

A further advantage of the present invention is that the present invention provides a transfer apparatus which can handle wafers with essentially no generation of particulates due to abrasion, since essentially no sliding contacts are made.

Another advantage of the wafer transport mechanism of the present invention is that control is simplified. That is, the transfer arm preferably used has only two degrees of freedom, and position registration is provided so that the transfer arm control can be provided very simply (by use of stepper motors or comparable apparatus), without the need for sensors to detect the position of or forces on the arm.

A related advantage of the wafer transport mechanism of the present invention is that it is a stable mechanical system. That is, small errors in positioning do not accumulate, but are damped out by inherent negative feedback provided by some of the mechanical elements used. This also facilitates the advantage of simple control.

A further advantage of the present invention is that the wafer handling equipment used in the load lock takes up minimum volume. Since the load lock is of such small volume, vacuum cycling can be performed rapidly without requiring very expensive large vacuum pumps.

An even more important consequence of the volume efficiency of wafer transport according to the present invention is that the upper portion of the load lock (wherein the defect-sensitive surfaces of wafers being transferred will be exposed) will therefore have a small surface area. It is desirable to have as little surface area as possible within line-of-sight of the wafer surface, and it is also desirable to have as little surface area as possible in close proximity to the wafer surface, whether it is within line-of-sight or not. All surface area in the upper part of the load lock (i.e. the part above the exhaust manifold) presents two hazards: first, all surface area will desorb gasses, so that the more surface area is in the upper chamber the more difficult it will be to pull a hard vacuum. Second and more important, all surface area has the potential to hold adherent particulates, which can later be expelled by mechanical vibration or shock to fly ballistically onto the wafer surface, even under high vacuum. Thus, the volumetric efficiency of the load lock according to the present invention means that the potential for ballistic transport of particulates onto the wafer surface is reduced.

Moreover, the alternative embodiment disclosed in this continuation-in-part application has the further advantage that the wafers themselves do not ever see even the surfaces in the load lock which were exposed to particulates during loading of the carrier into the lock. In this embodiment the wafer carrier has a vacuum-sealable vertically removable cover, instead of a vacuum sealable hinged door, and, after the carrier is positioned in an upper chamber (the primary load lock) the carrier body is lowered from beneath the cover into a lower chamber while the cover remains in place and covers the aperture between upper and lower chambers. Thus, the wafer carrier body, and the wafers in it, not only never see dirty ambient atmosphere, they never even see surfaces which are exposed to dirty ambient atmosphere.

Another advantage resulting from the compactness of the wafer handling equipment in a load lock according to the present invention is that clean room floor space (which is very expensive) is not excessively consumed by such an apparatus.

Another advantage of the wafer carrier described in the present patent application is that this wafer carrier cannot inadvertently be opened outside a clean room. A substantial yield problem in conventional clean room processing is inadvertent or careless exposure of wafers to particulates by opening the wafer carrier outside the clean room environment. However, with the wafer carrier of the present invention this is inherently impossible, since the pressure differential on the door of the carrier holds it firmly shut except when the carrier is in vacuum. This is another reason why the present invention is advantageous in permitting easy transport and storage of wafers outside a clean room environment.

In a further class of embodiments of the present invention, a process module (which may optionally contain one process station or more than one process station) has more than one load lock according to the present invention attached to it. Thus, processing can continue on wafers transferred in from one load lock while the other load lock is being reloaded. Moreover, the provision of two transfer mechanisms means that, if a mechanical problem occurs with one transfer apparatus inside its load lock, the processing station can continue in production, using transfer through the other load lock, while a technician is summoned to correct the mechanical malfunction. Thus, this class of embodiments has the advantage of greater throughput.

According to the present invention there is provided: a method for fabricating integrated circuits, comprising the steps of: providing a plurality of wafers in a vacuum sealable wafer carrier box, said wafer carrier box comprising a cover which is vacuum sealed to a body thereof, said cover being removable from said body in a direction which is substantially normal to the plane of wafers supported in said body; placing said wafer carrier box into a vacuum sealable load lock upper chamber having a partial floor with an aperture therein and a stage positioned below said aperture in close proximity to said floor; pumping down said load lock upper chamber to a pressure less than 10 to the $-5$ Torr; lowering said stage, so that said cover remains supported on said partial floor in said upper process chamber while said body including wafers is lowered into the lower chamber; transferring wafers in a desired sequence from said wafer carrier under vacuum to one or more selected process stations which are enclosed inside a connecting contiguous vacuum-tight space with said lower chamber until a desired sequence of processing operations has been completed; and then raising said stage to rejoin said wafer carrier body with said wafer carrier cover and again effect a vacuum seal therebetween; venting said upper chamber to ambient; and removing said wafer carrier from said upper chamber.

According to the present invention there is provided: a wafer carrier comprising: a wafer carrier body including supports which include ledges tapered to support a flat disk with substantially line contact and not area contact; said wafer carrier having said supports continuous with a base, said base including a vacuum seal thereon surrounding said side supports; said wafer carrier further comprising a cover, said cover being shaped to mate with said vacuum seal of said wafer carrier body, said cover, said vacuum seal, and said body defining a vacuum tight enclosure, said cover being removable from said body in a direction substantially normal to the plane of said vacuum seal.

According to the present invention there is provided: a wafer carrier comprising a body including sidewalls and also a cover closeable to make a vacuum-tight seal with said body, said sidewalls each having plural ledges thereon defining slots to hold wafers of a predetermined size, said ledges on said sidewalls having at least one surface thereof sloped to be at least 5 degrees out of parallel with the plane of said slots.

According to the present invention there is provided: a wafer carrier comprising a body including sidewalls and also a cover closeable to make a vacuum-tight seal with said body, said sidewalls each having plural ledges thereon defining slots to hold wafers of a predetermined size, said ledges on said sidewalls having at least one surface thereof sloped to be at least 5 degrees out of parallel with the plane of said slots; said carrier further comprising an elastic element on an inner surface thereof, said elastic element holding wafers of said predetermined size secure against free movement.

According to the present invention there is provided: a method of transporting integrated circuit wafers during fabrication, comprising the steps of: carrying said wafers under vacuum in a vacuum-tight carrier comprising a body including sidewalls and also a cover closeable to make a vacuum-tight seal with said body, said sidewalls each having plural ledges thereon defining slots to hold wafers of a predetermined size, said ledges on said sidewalls having at least one surface thereof sloped to be at least 5 degrees out of parallel with the plane of said slots.

According to the present invention there is provided: a method of transporting integrated circuit wafers during fabrication, comprising the steps of: carrying said wafers under vacuum in a vacuum-tight carrier comprising a body including sidewalls and also a cover closeable to make a vacuum-tight seal with said body, said sidewalls each having plural ledges thereon defining slots to hold wafers of a predetermined size, said ledges on said sidewalls having at least one surface thereof sloped to be at least 5 degrees out of parallel with the plane of said slots; said carrier further comprising an elastic element on an inner surface thereof, said elastic element holding wafers of said predetermined size secure against free movement.

According to the present invention there is provided: a method of fabricating integrated circuits, comprising the steps of: transporting integrated circuit wafers during fabrication, comprising the steps of: carrying said wafers under vacuum in a vacuum-tight carrier comprising a body including sidewalls and also a cover closeable to make a vacuum-tight seal with said body, said sidewalls each having plural ledges thereon defining slots to hold wafers of a predetermined size, said ledges on said sidewalls having at least one surface thereof sloped to be at least 5 degrees out of parallel with the plane of said slots; said carrier further comprising an elastic element on an inner surface thereof, said elastic element holding wafers of said predetermined size secure against free movement.

According to the present invention there is provided: a method for fabricating integrated circuits, comprising the steps of: providing a plurality of wafers in a wafer carrier having a cover vacuum sealable to a body, said body including slots for holding wafers; placing said wafer carrier into a vacuum sealable load lock attached to a process module; pumping down said load lock to a pressure less than 10 to the $-5$ Torr, so that said vacuum seal between said carrier body and carrier cover releases; removing said carrier body from said cover, while said cover remains in said lock, so that wafers inside said carrier body are never exposed in line-of-sight to any substantial portion of the interior of said load lock; extending a transfer arm into said wafer carrier body, to remove a selected one of said wafers therefrom; transferring wafers in a desired sequence from said wafer carrier under vacuum to one or more selected process stations and back until a desired sequence of processing operations has been completed; and then closing said wafer carrier and raising the pressure of said load lock to approximately atmospheric, so that said wafers remain in vacuum inside said wafer carrier while said wafer carrier is held closed by differential pressure.

BRIEF DESCRIPTION OF THE DRAWINGS

The present invention will be described with reference to the accompanying drawings, wherein:

FIGS. 1a through 1e show another sample embodiment, wherein the wafer carrier 10 prime is configured so that, instead of having an openable sealed door 14, it has a liftable sealed cover 14 prime, which is joined to the body of the wafer carrier by a vacuum seal 13 prime;

DESCRIPTION OF THE PREFERRED EMBODIMENTS

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

Figure 1:
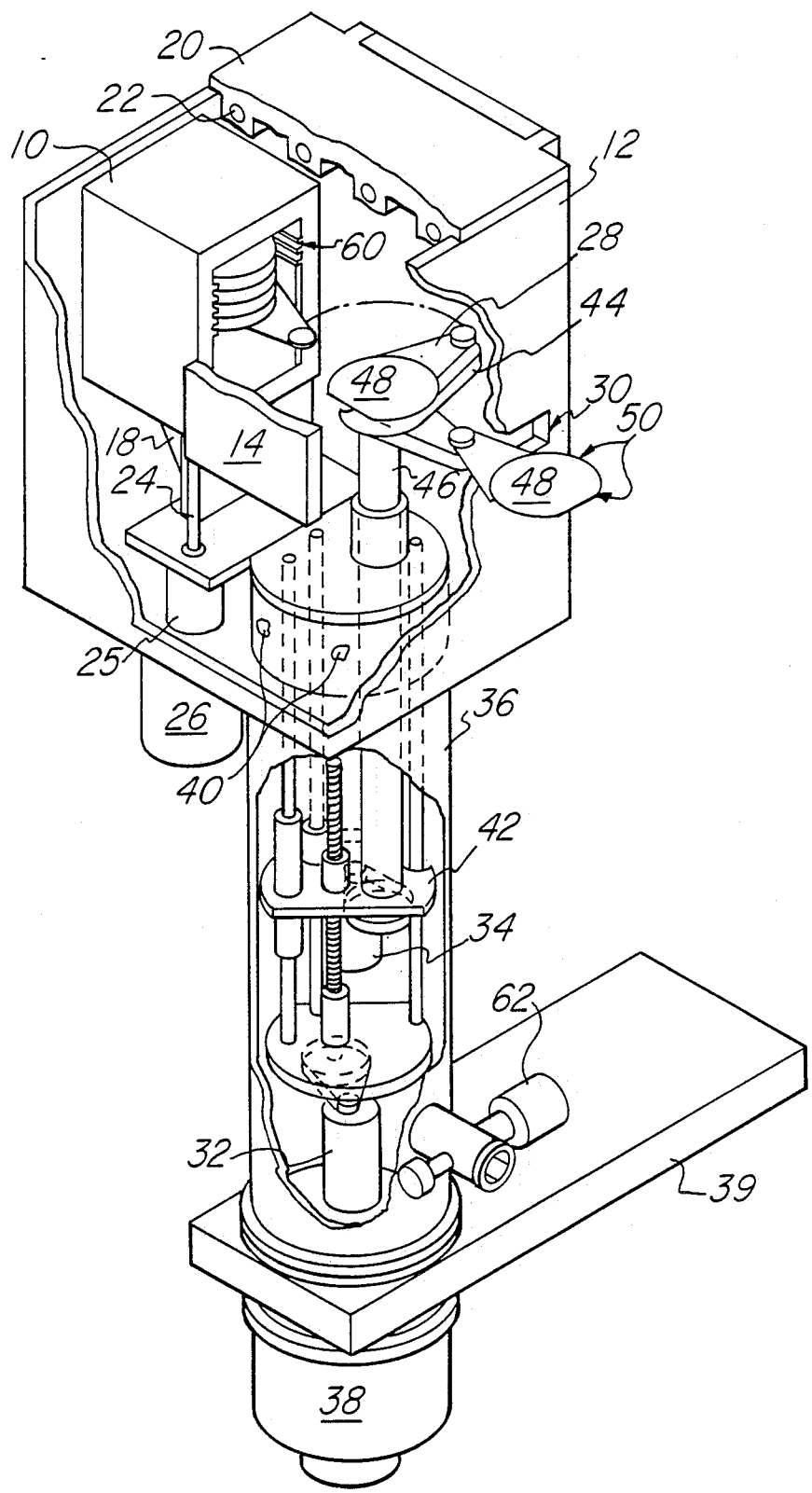
FIG. 1 shows a sample embodiment of a vacuum load lock according to the present invention, with a wafer carrier according to the present invention shown therein in the process of loading and unloading.
Figure 4:
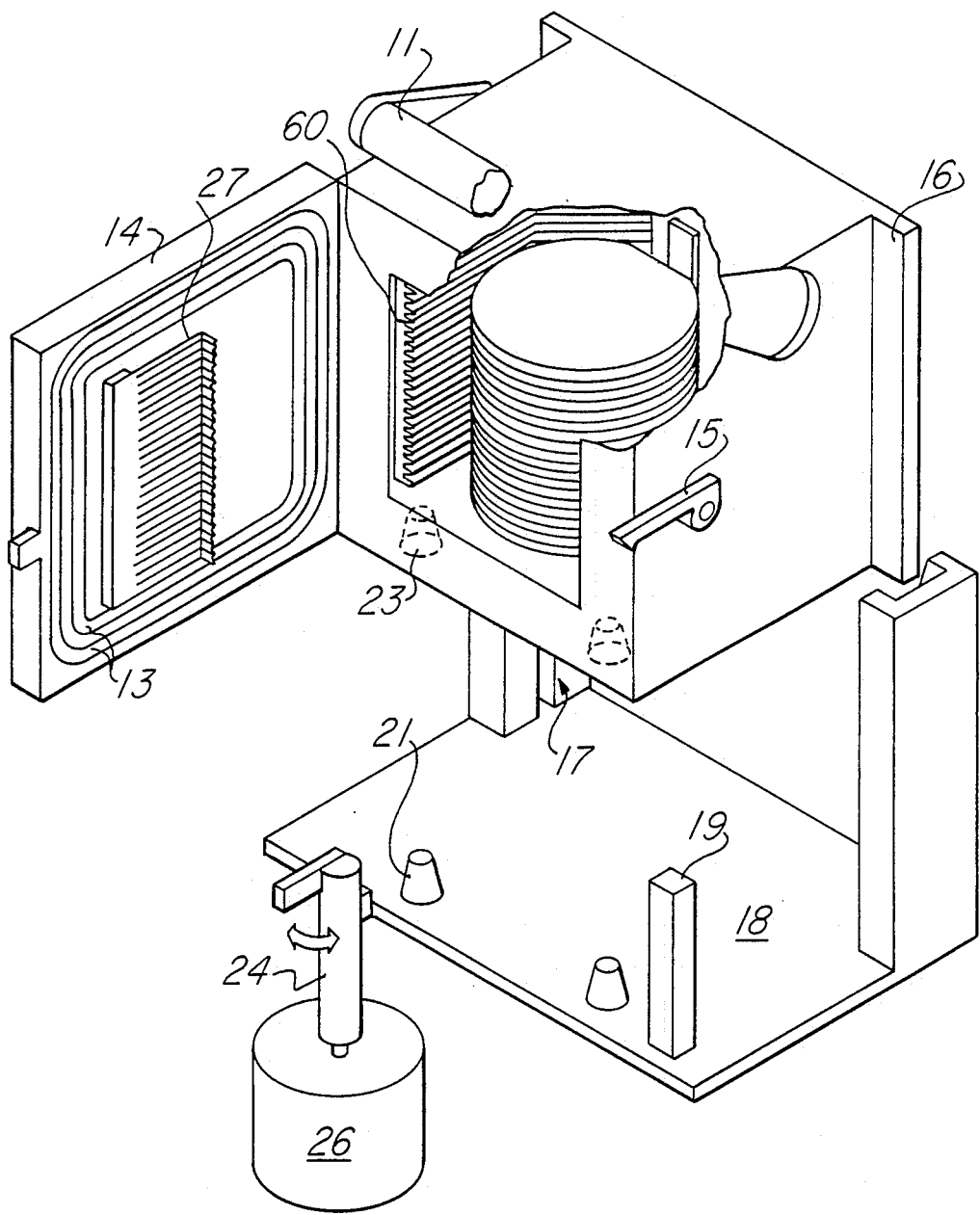
FIG. 4 shows a closer view of a sample embodiment of the wafer carrier 10, docked onto the platform 18 inside the load lock 12 to provide mechanical registration of the position of the wafers.

FIG. 1 shows a sample embodiment of the invention. This embodiment shows a wafer carrier 10 inside a vacuum load lock chamber 12. The wafer carrier 10 is also shown, in slightly greater detail, in FIG. 4.

The carrier 10 is shown with its door 14 standing open. The door 14 preferably has a vacuum seal 13 where it mates with the body of the carrier 10, so that the wafer carrier can be carried around under atmospheric pressure for at least several days (preferably at least several tens of days) without enough leakage to raise the internal pressure above $10^{-5}$ Torr.

The wafer carrier 10 is adapted to dock with a platform 18 (which is only partially visible in FIG. 1, but is shown in more detail in FIG. 4), so that, when a technician places a wafer carrier 10 inside the load lock 12, the position of the carrier 10 will be accurately known. In the presently preferred embodiment, the wafer carrier 10 has ears 16 which engage vertical slots 17 fixed to the position registration platform 18, so that the technician can slide the carrier into these slots until it rests on the platform 18, and thereby assure that the position of the carrier 10 is definitely known. In the presently preferred embodiment, the platform 18 includes two tapered pins 21 (one conical and one wedge-shaped) positioned to engage tapered holes 23 in the underside of the wafer carrier 10, but a wide variety of other arrangements could be used to assure mechanical registration, as will be obvious to any ordinarily skilled mechanical engineer.

The carrier 10 preferably has a safety catch 15 on it which secures the door 14 from falling open. However, under normal conditions of transport, this safety catch is not needed, since atmospheric pressure holds the door 14 shut against the internal vacuum of the carrier. When the carrier 10 is placed inside the load lock 12, a fixed finger 19 will push against the safety catch 15 to release it, so that the door 14 can be opened.

When the carrier 10 is docked with the platform 18, the door 14 will also be engaged with the door opening shaft 24. Preferably the door 14 has a shallow groove in its underside, which mates with a finger and arm 25 on the top of the door opening shaft 24. Thus, after the load lock has been pumped down so that differential pressure no longer holds the door 14 closed, the door can be opened by door opening shaft 24.

After the technician has placed the wafer carrier 10 in the vacuum load lock 12 and closed the load lock lid 20, a high pressure purge (with dry nitrogen or other clean gas) is preferably applied through manifold 22 inside load lock lid 20. This high pressure purge provides vertical flow, to tend to transport particles downward, and also helps to blow off some of the large particles which will have collected on the wafer carrier 10 during its exposure to atmospheric conditions. After this initial purge stage (e.g. for 30 seconds or more), the chamber is then slowly pumped down to 10 to the $-5$ Torr or less. This pump down stage is preferably relatively slow, in order not to stir up random particulates. That is, while low pressures do permit particles to fall from the air, those particles will still be available on the bottom of the chamber, and must not be stirred up if this can be avoided.

In order to make sure that the airborne particulates have actually fallen out of the chamber air, the interior of the vacuum load lock will then preferably be allowed to stay at 10 to the $-5$ Torr for a few seconds, to make sure that all of the particles which are able to fall out of the air will do so.

It may also be advantageous, as an optional modified embodiment of the invention, to use a sloped bottom and/or polished sidewalls for the load lock, to reduce the population of particulates sticking to the sidewalls and bottom which can be sent flying by mechanical vibration. The present invention greatly reduces the problems of airborne particulates, which has always been the dominant type of particulate transport, so that the problem of ballistically transported particulates can now be usefully addressed. A related optional modification is the use of an in-situ vacuum particle counter in the upper chamber, so that any increase in particle population in the critical volume can be detected. Such an in-situ particle counter can be built using a resonant circuit to measure charge transfer in a high-voltage vacuum-gap capacitor, or (for particles sufficiently large) by using a laser-driven optical cavity with a multiply-folded optical path, or by other means.

Optionally, this particulate sensor (or a second particulate sensor which is better adapted to sensing particulates at higher pressures) can be used to control the nitrogen shower prior to initial pumpdown. That is, instead of doing the nitrogen shower simply for a fixed duration, it may be protracted if the particulate monitor shows that the box was in an unusually dirty environment. It may even be desirable to pump the load lock down to a soft vacuum (using the roughing pump) and then bleed gas through the nitrogen shower ports, to create a downward flow. It may also be desirable to cycle the load lock from a soft vacuum (e.g. 100 milliTorr or so) up to atmospheric again, by intiating another nitrogen shower cycle, if the particulate monitor indicates that that particulate level is still excessive at the time the load lock has reached a given soft vacuum pressure.

Note that vacuum gauges 62 are preferably connected to the interior of the load lock chamber. Preferably the sensors 62 include a high-pressure gauge (such as a thermocouple), a low pressure gauge (such as an ionization gauge), and a differential sensor which accurately senses when the load lock interior pressure has been equalized with the atmosphere. Thus, the door of a carrier 10 is not opened until these gauges indicate that a good vacuum has been achieved inside the load lock.

After a roughing pump (not shown) has brought the chamber down to a soft vacuum, the gate valve 39 can be opened to connect the turbomolecular pump 38 to the interior of the load lock, and the turbomolecular pump 38 can then be operated to bring the pressure down to $10^{-5}$ Torr or less.

At this point, the pressures inside the wafer carrier 10 and the vacuum load lock 12 are more or less equalized, and the door 14 can be activated by operating motor 26, which is connected to door opening shaft 24 through vacuum feedthrough 25.

Preferably two sensor switches are also included inside vacuum load lock 12, to ascertain when door 14 is in its fully opened position, and when door 14 is fully shut. Thus, after the load lock 12 has been pumped down and allowed to sit for a few seconds, door opening shaft 24 is rotated to open the door 14, until the sensor detects that the door is fully open. During this time, the transfer arm 28 is preferably kept in its home position at an elevation below the bottom of the door, so that the door 14 has clearance to open. After the sensor detects that the door 14 is fully open, the transfer arm can begin to operate.

The transfer arm 28 preferably has two degrees of freedom. One direction of motion permits the transfer arm 28 to reach into carrier 10 or through port 30 into the adjacent processing chamber. The other degree of freedom corresponds to vertical motion of the transfer arm 28, which permits selection of which wafer inside the carrier 10 is to be removed, or which slot a wafer is to be placed into.

In the presently preferred embodiment, an elevator drive motor 32 is used to control the elevation of the transfer arm 28, and arm drive motor 34 controls the extension and retraction of the transfer arm 28. Note that both of these motors, in the presently preferred embodiment, do not require vacuum feedthrough, but are housed inside the exhaust manifold 36 which leads from the load lock 12 to the vacuum pump 38, which may be, for example, a turbomolecular pump. Moreover, the exhaust manifold 36 does not open directly into the load lock chamber 12, but instead has apertures 40 around its top. That is, the exhaust manifold 36 is preferably configured so that there is not any line of sight path from the drive motors 32 or 34 or from the pump 38 into the load lock chamber. This helps to reduce ballistic transport of particules from these moving elements into the load lock chamber.

The elevator drive motor 32 is preferably connected to drive a sub-platform 42 up and down, and the arm drive motor 34 is preferably mounted on this platform 42.

In the presently preferred embodiment, a linkage is used inside the rotatable transfer arm support 44, to permit the transfer arm 28 to move very compactly. The transfer arm support 44 is preferably connected to a rotating rod which is driven by the arm drive motor 34, but the arm support 44 is preferably mounted on a tubular support 46 which does not rotate. An internal chain and sprocket linkage is preferably used so that the joint between arm support 44 and transfer arm 28 moves with twice the angular velocity of the joint between arm support 44 and tubular support 46. (Of course, many other mechanical linkages could alternatively be used to accomplish this.) This means that, when the arm support 44 is in its home position, a supported wafer 48 will be approximately above the tubular support 46, but when the arm support 44 is rotated 90 degrees with respect to the tubular support 46, the transfer arm 28 will have been rotated 180 degrees with respect to the arm support 44, so the transfer arm can either extend straight into the wafer carrier 10 or else straight through the port 30 into the adjacent processing chamber. This linkage is described in greater detail in U.S. patent application Ser. No. 664,448, filed 10/24/84, which is hereby incorporated by reference.

The transfer arm 28 preferably is a thin piece of spring steel, e.g. 0.030 inch thick. The transfer arm has 3 pins 50 on it to support the wafer. Each pin 50 preferably includes a small cone 52 on a small shoulder 54. The cone 52 and shoulder 54 are preferably made of a material which is soft enough to not scratch silicon. In the presently preferred embodiment, these portions (which are the only portions of transfer arm 28 which will actually touch the wafers being transported) are preferably made of a high-temperature plastic (i.e. a plastic with a relatively low propensity to outgas under vacuum) such as Ardel (a thermoplastic phenyl acrylate, made by Union Carbide) or Delrin. Note that the use of cones 52 at the center of the locating pins 50 permits very slight misalignments of the wafer to the transfer arm 28 to be corrected: in other words the system of wafer transport according to the present invention is a stable mechanical system, wherein small misalignments during successive operations will not accumulate, but will be damped out.

Note that, in the positioning of the wafer 48 as shown, one of the three pins 50 rests against the flat portion 56 of the wafer's circumference. This means that, in this embodiment, the three pins 50 on the transfer arm 28 do not define a circle of the same diameter as the diameter of the wafers 48 to be handled.

To assure that the wafer flats 56 do not interfere with accurate handling of the wafers, the box 10 preferably has a flat surface on its interior back side which the flats 56 of the wafers 48 will rest against. A spring compression element on the inside surface of the door 14 pushes each wafer against this flat surface when the door 14 is closed, so that the wafers do not rattle around in transit. This also assures that, when the door 14 is opened, the location of the flat 56 on each wafer 48 is accurately known.

Thus, after the box 10 is in the chamber 12 with its door 14 open, elevator drive motor 32 is operated to bring the transfer arm 28 to just below the height of the first wafer which it is desired to remove, and arm drive motor 34 is then operated to extend the transfer arm 28 into the interior of the box 10. By operating the elevator drive motor 32 briefly, the transfer arm 28 is then raised, in this position, until the three pins 50 around its circumference lift the desired wafer off of the ledges 60 on which it has been resting inside the carrier box 10.

Note that the ledges 60 preferably have tapered surfaces rather than flat surfaces, so that contact between the ledges 60 and the wafer 48 resting on them is a line contact rather than an area contact, and is limited to the edge of the wafer. That is, in prior art wafer carriers area contact may be made over a substantial area, of many square millimeters, but the line contact used in the present invention makes contact only over a much smaller area, typically of a few square millimeters or less. An alternative definition of the line contact used in this embodiment of the invention is that the wafer support contacts the surface of the wafer only at points which are less than one millimeter from its edge.

Thus, by raising the transfer arm 28, the desired wafer 48 will be picked up, and will be resting on the cones 52 or shoulders 54 of the three pins 50 on the transfer arm 28.

In the presently preferred embodiment, the ledges 60 have a center-to-center spacing of 0.187 inches inside the box. This center spacing, less the thickness of the wafers, must allow clearance enough for the height of the transfer arm 28 plus the pins 50, but need not be much more. For example, in the presently preferred embodiment, the transfer arm is about 0.080 inch thick, including the height of the cones 52 on the transfer pins 50. The wafers themselves will be about 0.021 inch thick (for the presently preferred embodiment wherein 4 inch wafers are used) so that about 0.085 inch clearance is available. Of course, larger diameter wafers will have greater thicknesses, but the present invention is eminently suited to such larger diameter wafers, since the size of the box 10 and the center spacing of the ledges 16 inside the box 10 can simply be scaled appropriately.

Thus, after the transfer arm 28 has picked up a desired wafer 48, the arm drive motor 34 is operated to bring the transfer arm 28 to the home position.

The elevator drive motor 32 is then operated to bring the transfer arm 28 to a height where it can reach through the port 30.

Figure 3:
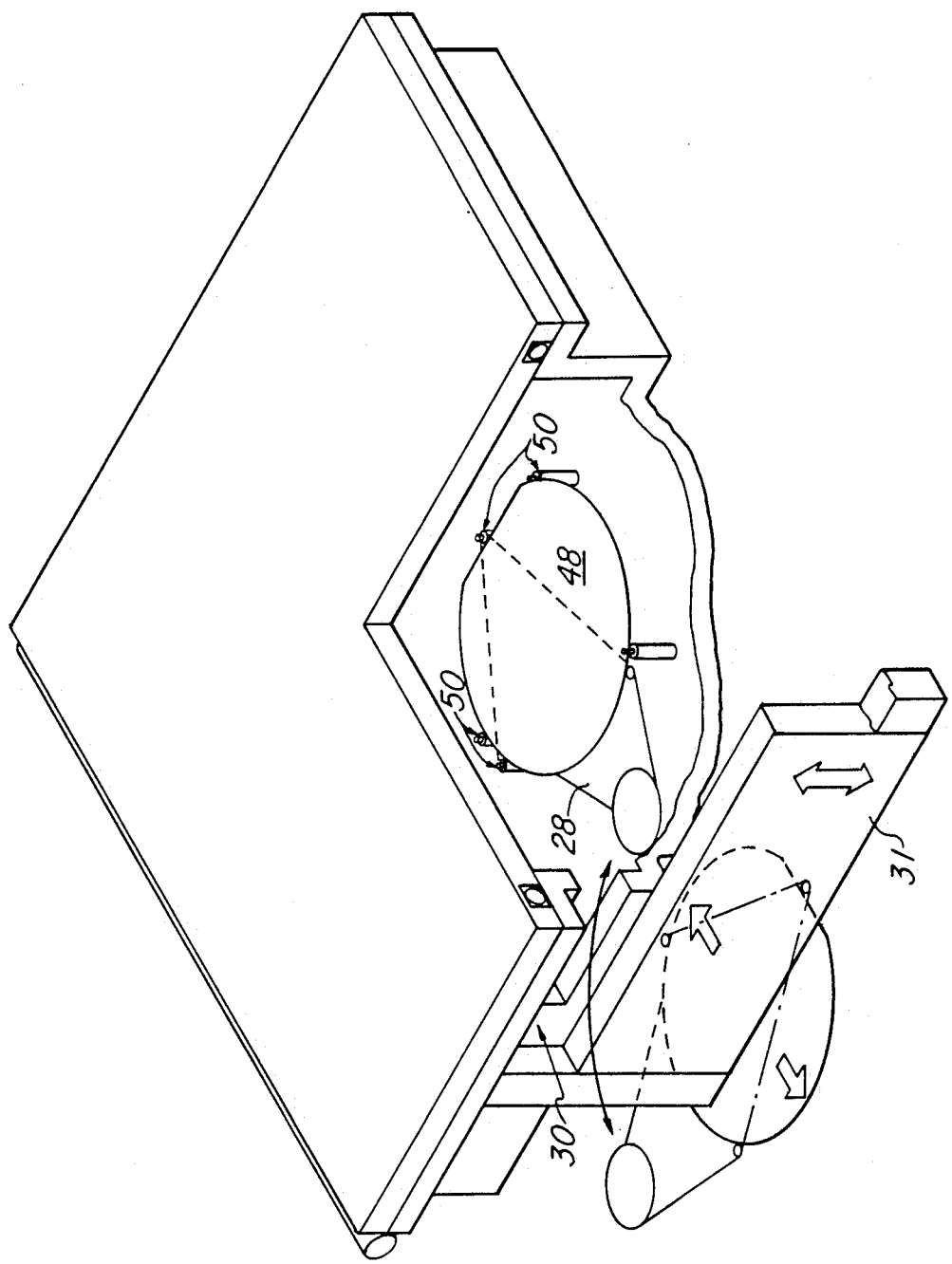
FIG. 3 shows a sample wafer transfer structure, in a processing station, wherein the wafer is placed onto three pins by the transfer arm 28 reaching through the port 30 from the adjacent load lock 12.

Port 30 is preferably covered by an isolation gate 31 unlike the gate 31 shown in FIG. 3: the gate 31 preferably seals the port 30 without making sliding contact. (Again, the absence of sliding contact is advantageous to reduce internally generated particulates.)

In the present embodiment, the isolation gate 31 over port 30 is preferably operated by an air cylinder, but a stepper motor may be used instead. Thus, a total of four motors are used: two which use vacuum feedthroughs, and two which are preferably contained inside the exhaust manifold 36.

The arm drive motor is now operated again, to extend the transfer arm 28 through port 30 into the adjacent processing chamber.

The adjacent processing chamber may be any one of many different kinds of processing stations. For example, this station may be an implanter, a plasma etch, or a deposition station.

In the presently preferred embodiment, the transfer arm reaching through the port 30 will place the wafer 48 on three pins 50, as shown in FIG. 3, like those used in the transfer arm itself. (Note that the port 30 preferably has enough vertical height to permit some vertical travel while the arm 28 is extended through port 30, so that arm 28 can move vertically to lift a wafer from or deposit a wafer onto pins 50 inside the processing chamber.)

Alternatively, the processing chamber may include a fixture having spaced sloped ledges like the ledges 16 inside the transfer box, or may have other mechanical arrangements to receive the wafer. However, in any case, the arrangement used to receive the transferred wafer must have clearance on the underside of the wafer (at least at the time of transfer), so that the transfer arm 28 can reach in on the underside of the wafer to emplace or remove it. If pins 50 are used to receive the transferred wafer, it may be desirable to provide a bellows motion or a vacuum feedthrough in order to provide vertical motion of the wafer support pins inside the processing chamber. Thus, for example, where the processing chamber is a plasma etch or RIE (reactive ion etch) station, a feedthrough may be provided to position the wafer 48 onto a susceptor after the transfer arm 28 has been withdrawn out of the way of the wafer.

Of course, the processing chamber may be an engineering inspection station. A vacuum-isolated microscope objective lens will permit inspection of wafers in vacuum and (using an appropriately folded optical path) in a face-down position. This means that heavy use of engineer inspection can be made where appropriate, without the loss of engineer time and clean-room quality which can be caused by heavy traffic through a clean-room.

In any case, the transfer arm 28 is preferably withdrawn, and the isolation gate over port 30 closed, while processing proceeds. After processing is finished, the isolation gate over port 30 is opened again, the arm 28 is extended again, the elevator drive motor 32 is operated briefly so that the arm 28 picks up the wafer 48, and the arm drive motor 34 is again operated to bring the transfer arm 28 back into the home position. The elevator drive motor 32 is then operated to bring the transfer arm 28 to the correct height to align the wafer 48 with the desired slot inside the wafer carrier. The arm drive motor 34 is then operated to extend the transfer arm 28 into the wafer carrier 10, so that the wafer 48 which has just been processed is sitting above its pair of ledges 60. The elevator drive motor 32 is then briefly operated to lower the transfer arm 28, so that the wafer is resting on its own ledges 60, and the arm drive motor 34 is then operated to retract the transfer arm 28 to home position. The sequence of steps described above is then repeated, and the transfer arm 28 selects another wafer for processing.

Note that, with the mechanical linkage of the transfer arm 28 and arm support 44 described above, the wafers being transferred will move in exactly a straight line if the center to center lengths of transfer arm 28 and arm support 34 are equal. This is advantageous because it means that the side of the wafer being transferred will not bump or scrape against the sides of the box 10 when the wafer is being pulled out of or pushed into the box. That is, the clearances of the wafer carrier box can be relatively small (which helps to reduce particulate generation by rattling of the wafers during transport in the carrier) without risking particulate generation due to abrasion of the wafers against the metal box sides.

Processing continues in this fashion, wafer by wafer, until all the wafers inside the carrier 10 (or at least as many of them as desired) have been processed. At that point the transfer arm 28 is returned empty to its home position and lowered below the lower edge of the door 14, and the isolation gate over port 30 is closed. The door opening shaft 24 is now rotated to close door 14, and provide initial contact for the vacuum seals between door 14 and the flat front surface of carrier 10, so that the carrier is ready to be sealed (by pressure differential) as the pressure inside the load lock is increased. The load lock 12 can now be pressurized again. When the differential sensor of the vacuum gauge 62 determines that the pressure has come up to atmospheric, the load lock lid 20 can be opened and the wafer carrier 10 (which is now sealed by differential pressure) can be manually removed. In the preferred embodiment, a folding handle 11 is provided on the top side of the carrier, to assist in this manual removal without substantially increasing the volume required for the carrier inside the load lock.

After the carrier has been removed, it can be carried around or stored as desired. The seals 13 will maintain a high vacuum in the carrier meanwhile, so that particulate transport to the wafer surfaces (and also adsorption of vapor-phase contaminants) is minimized.

Note that the wafer carrier also includes elastic elements 27 mounted in its door. These elastic elements exert light pressure against the wafers 48 when the door 14 is closed, and thus restrain them from rattling around and generating particulates. The elastic element 27 is configured as a set of springs in the embodiment shown, but other mechanical structures (e.g. a protruding bead of an elastic polymer) could alternatively be used to configure this. Where the wafers used have flats, a flat contact surface 29 is preferably provided on the inner back surface of the wafer carrier box 10 for the slice flats to be pressed against.

Note also that the ledges 60 on the sidewalls of the carrier box 10 are tapered. This helps to assure that contact with the supported surface of the wafer is made over a line only, rather than over any substantial area. This reduces wafer damage and particulate generation during transport. This also assists in damping out the accumulation of positioning errors, as discussed.

The load lock lid 20 preferably has a window in it, to permit operator inspection of any possible mechanical jams.

An advantage of the present invention is that, in the case of many possible mechanical malfunctions, the door of the wafer carrier 10 can be closed before attempts are made to correct the problem. For example, if somehow the transfer arm 28 picks up a wafer so that the wafer is not sitting properly on all three of the pins 50, the door drive motor 26 can be operated to close the door 14 before any attempts are made to correct the problem. Similarly, port 30 can be closed if the transfer arm 28 can be retracted into home position. It may be possible to correct some such mechanical misalignment problems simply by deviating from the normal control sequence. For example, the position of a wafer 48 on transfer arm 28 may in some cases be adjusted by partially extending the transfer arm 28, so that the edge of wafer 48 just touches the outside of door 14, or of the isolation gate over port 30. If this does not work, the load lock 12 can be brought back up to atmospheric pressure (with the door 14 of wafer carrier 10 closed) and the load lock lid 20 opened so that the problem can be manually corrected.

Note that all of the operations described above can be very easily controlled. That is, no servos or complex negative feedback mechanisms are needed. All four of the motors described are simple stepper motors, so that multiple stations according to the present invention can be controlled by a single microcomputer. The mechanical stability of the system as a whole—i.e. the inherent correction of minor positioning errors provided by the tapered pins of the wafer supports, by the slope of the wafer support ledges in the wafer carrier, and by the flat on the backwall of the wafer carrier—helps to prevent accumulation of minor errors, and facilitates easy control.

This advantage of simple control is achieved in part because good control of mechanical registration is achieved. As noted, the docking of the carrier 10 with platform 18 provides one element of mechanical registration, since the location of the platform 18 with respect to the transfer arm 28 can be accurately and permanently calibrated. Similarly, the wafer carriers 10 do not need to be controlled on each dimension, but merely need to be controlled so that the location and orientation of the support shelves 60 are accurately known with respect to the bottom (or other portion) of the box which mates with support platform 18. As described above, this is preferably accomplished by having channels which the wafer carrier slides into until it rests on the platform 18, but many other mechanical arrangements could be used instead.

Similarly, mechanical registration must be achieved between the home position of the transfer arm 28 and the support pins 50 (or other support configuration) which the wafer will be docked to inside the processing chamber. However, this mechanical registration should be a simple one-time setup calibration.

Note that angular positioning will be preserved by the box itself: as was noted, whenever the door 14 is closed, spring elements inside it will press the wafers 48 against the flat on the interior back surface of the box.

Optionally, the wafer carrier 10 could be provided with a quick-connect vacuum fitting, to permit separate pumpdown on the carriers 10. However, in the presently preferred embodiment this is omitted, since it is not necessary and since it simply provides another source of possible unreliability.

Note that the load lock mechanism described need not be used solely with vacuum-tight wafer carriers, although that is the most preferred embodiment. This load lock can also be used with wafer carriers which carry atmospheric pressure inside. Although this is not the most preferred embodiment, it still carries substantial advantages, as is discussed above, over prior art load lock operations.

It should be noted that a wafer carrier as described can be made in different sizes, to carry any desired number of wafers. Moreover, a wafer carrier according to the present invention can be used to carry or store any desired number of wafers, up to its maximum. This provides additional flexibility in scheduling and process equipment logistics.

Figure 5:
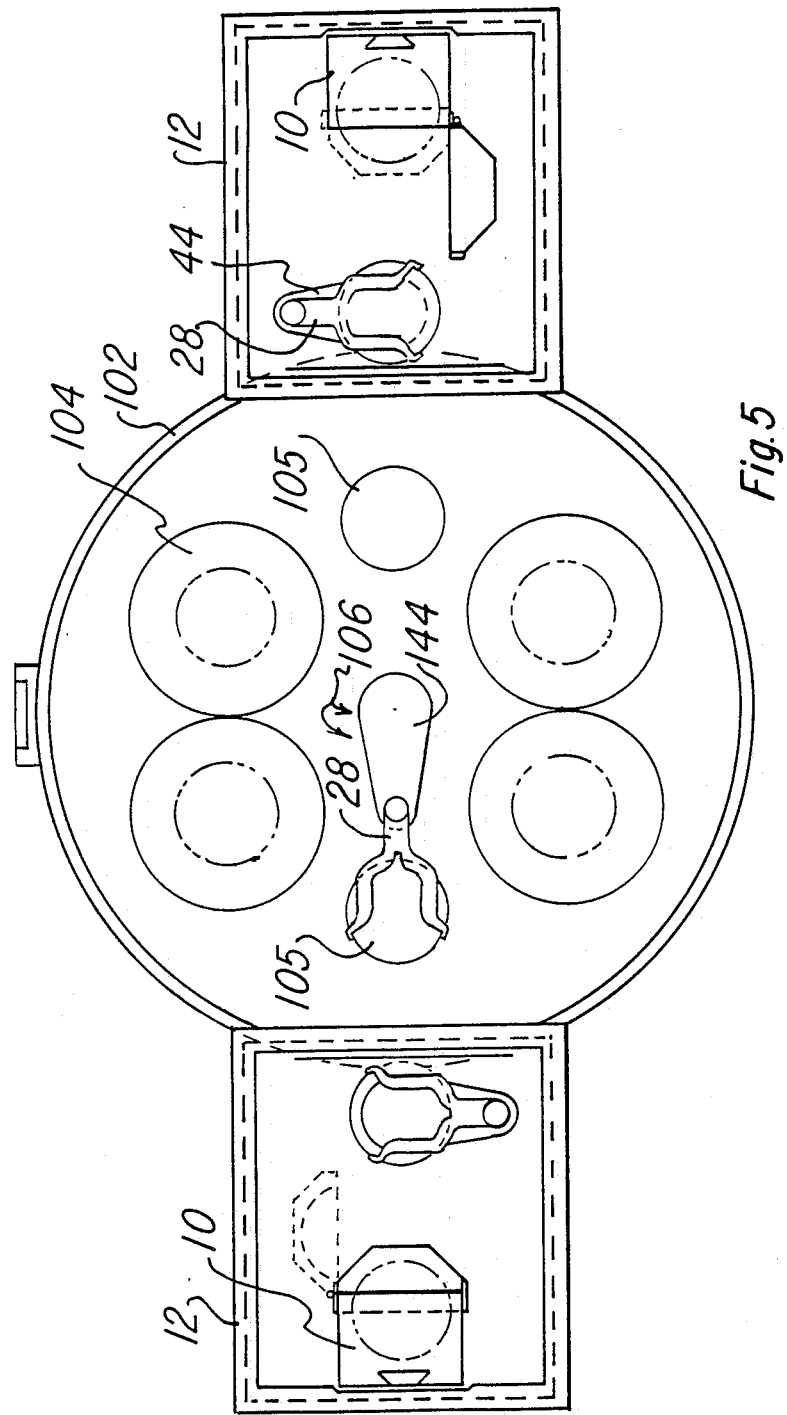
FIG. 5 shows a plan view of a sample processing module, containing four process stations and two wafer transfer stages, and a load lock adjacent to each of the wafer transfer stages.

FIG. 5 shows a sample further alternative embodiment wherein two load locks, each containing a wafer carrier 10, are both connected to a process module 102 which contains four process stations 104. When the transfer arm 28 reaches through the port 30 from a load lock 12 into the process module 102, it places its wafer onto one of two wafer stages 106. These wafer stages 106, as discussed above, can be three pin supports or two ledge supports, or may have other mechanical configurations that would be obvious to those skilled in the art, as long as there is space underneath the supported wafer for the transfer arm 28 to lower free of the wafer and retract after it has placed the wafer on the supports. (It is preferable, however, that the wafer support used be such as to make line contact, rather than contact over any substantial area, to the under surface of the wafer.)

Another transfer arm assembly 106 is provided inside the process module. This transfer arm assembly is generally similar to the transfer arm assembly 28, 44 and 46 used inside the load lock, but there are some differences. First, the transfer arm 28 used inside the load lock only needs to move wafers in a straight line. By contrast, the transfer arm assembly 106 must also be able to move radially, to select any one of the process modules 104. Thus, an additional degree of freedom is needed. Second, the reach of the transfer arm assembly 106 need not be the same as the transfer arm assemblies (28,44,46) used inside the load lock, and in fact the reach of transfer arm 106 is preferably larger, to permit adequate spacing of the process stations 104. Third, the arm assembly 106 does not need as much travel in elevation as the transfer arms 28 used in the load locks. Fourth, in the configuration shown, the transfer arm 128 will not have one of its three pins 50 resting on a wafer flat, so that the diameter of the circle defined by pins 50 is not the same for arms 28 and 128, even though they are handling wafers of the same diameter.

The transfer arm assembly 106 is preferably essentially the same as the transfer arm assembly (28,44,46) used in the load lock, with these differences. By making the tubular support 46 rotatable and providing a third motor to drive this rotation, a third degree of freedom for the transfer arm is provided. Similarly, the dimensions of the transfer arm can simply be scaled as desired. Thus, transfer arm assembly 106 preferably includes a transfer arm 128 rotatably mounted on a transfer arm support 144. The transfer arm support 144 is pivotably mounted to a tubular support 146 (not shown), and an internal shaft, fixed to the transfer arm support 144, extends down through the tubular support 146. An internal chain drive with two to one gearing translates any differential rotation between tubular support 146 and arm support 144 into a further differential rotation (over twice as many degrees) between arm support 144 and transfer arm 128. An arm drive motor, mounted below the transport assembly 106, is connected to rotate the shaft which is fixed to arm support 144. An arm rotation motor is connected to rotate the tubular support 146. Finally, an elevator mechanism provides vertical motion of the transfer arm assembly 106.

Note that the vertical motion required of assembly 106 is not typically as much as that required of the transfer arms 28 in the load locks 12, since the transfer arm 128 will typically not need to select one of several vertically separated wafer positions like those in the wafer carrier 10, but will typically merely be used to pick and place wafers from a number of possible wafer stations which are all on the same plane. Thus, optionally the vertical elevation of the transfer 128 could be controlled by an air cylinder rather than by an elevator motor assembly as discussed above.

Thus, by rotating tubular support 146 simultaneously with the arm support 144, the transfer arm assembly 106 can be rotated without being extended. After the arm assembly 106 has been rotated to the desired position, the tubular support 146 can be held fixed while the arm support 144 is rotated, and this will cause the transfer arm 128 to extend as described above.

Thus, after transfer arm 28 from one of the load locks 12 has placed a wafer to be processed on one of the wafer stages 106, the transfer arm assembly 106 is rotated (if necessary), extended at a low position so that transfer arm 128 comes underneath the wafer, elevated so that transfer arm 128 picks up the wafer, and retracted to its home position. The assembly 106 is then rotated again, and the transfer arm 128 is extended, so that the wafer is now located above a wafer support in one of the process stations 104, or above the other wafer stage 106. By lowering the arm assembly 106, the wafer can now be placed on the wafer support or wafer transfer stage, and the arm 128 can now be retracted.

The process station 104 can now be sealed off from the main process module 102, and separate single-wafer processing of the wafer can begin. Meanwhile, the transfer arms 128 and 28 can perform other operations. When a wafer in a module 104 has completed processing, that process station 104 can then be pumped down to the same low pressure as the interior of process module 102, and process station 104 can be opened. The transfer arm assembly 106 can now be operated to remove this wafer, and transfer it either to one of the wafer stages 106 or to another one of the process modules 104.

One advantage of the present invention is that the process modules 104 can all be configured to do the same operation, which will permit wafer transport-limited throughput (even for fairly slow processing operations), if there is a sufficient number of process stations 104 in the process module 102; or, alternatively, different operations can be used in different ones of the process stations 104.

That is, the present invention permits the use of sequential processing, which is increasingly recognized as desirable, since processing variations caused by adsorbed contaminants or by native oxide are eliminated. For example, two of the process stations 104 can be configured for oxide growth, one for nitride deposition, and one for poly deposition, to permit complete in-situ fabrication of oxynitride poly-to-poly capacitors. Moreover, the provision of different process steps in the different stations 104 means that many lot splits and process variations can be performed simply by programming the appropriate operations, without relying on technicians to correctly identify which wafers should go to which machines. Thus, the capability to have different operations proceed in different ones of the process stations 104 provides additional processing flexibility.

Note also that the overall wafer transfer sequence is completely arbitrary, and may be selected as desired. For example, the wafers from one wafer carrier 10 could be completely processed and returned to that wafer carrier 10, and the load lock 12 containing the just-processed wafers could be sealed off from process module 102, so that the wafers in the other wafer carrier 10 in the other load lock 12 could be processed while a technician removed the carrier full of processed wafers from the other load lock 12. Alternatively, the programmability and random access of this arrangement could be used to shuffle and interchange wafers between the two carriers 10 in whatever fashion desired.

It should also be noted that this arrangement is not at all limited to two load locks 12 nor to four process stations 104, but the arrangement described can be scaled to other numbers of process stations 104 in a module 102, or other numbers of load locks 12 attached to a module 102, or to use of more than one transfer arm assembly 106 inside a module, if desired.

Note that this arrangement still preserves wafer orientation. Assuming that wafers are carried in carrier 10 with their flats toward the back of carrier 10, they will be placed on wafer stage 106 with their flats toward the center of module 102. Transfer arm 106 will preserve this orientation, so that, when flats are replaced in either wafer carrier 10, they will have their flats toward the back of the box.

Further classes of sample embodiments of the invention, embodying the novel concepts disclosed in the parent applications in some additional specific implementations, will now be described.

For example, in FIG. 5 of the parent application, it should be noted that this system could alternatively be configured with only one transfer arm instead of three. That is, the wafer carrier 10 could be positioned with respect to the central transfer arm 106 so that the central transfer arm 106 could reach directly through the open port into the wafer carrier to remove wafers, without the use of the two local transfer arms 28 in load locks 12. The advantage of this approach is that the additional mechanisms, controls, and vacuum feedthroughs required to operate the transfer arms 28 are eliminated. The disadvantage is that the vertical axis motion of the transfer arm assembly 106 must be increased, since arm assembly 106 now is required not merely to pick up or deposit a wafer, but to be able to access the full range of slices stacked in a wafer carrier 10. Second, the access port 30 must be made much larger, i.e. the port 30 must have enough vertical extent to permit the transfer arm assembly 106 to pass through it at the height of any of the wafers in the carrier 10. A further disadvantage is that the transfer arm assembly 106 must extend over a larger physical distance than would otherwise be required, which means that it will be more difficult to construct and operate this arm to avoid positioning errors. (If the mechanical positioning control of this system is considered as a control system, the error filtering provided by the temporary location of wafers on the stages 105 has been eliminated, and moreover the longer physical extension now required of the transfer arm assembly 106 means that larger raw errors in positioning will be introduced.) Moreover, the system may not be so modular and easily expandable. Thus, this class of embodiment is at present less preferred, but it is a viable class of embodiments of the invention, which may conceivably in the future become more preferred, and is therefore included here for clarity and completeness.

A further class of alternative embodiments uses a different shape wafer carrier. As discussed in the parent application as filed, a variety of wafer carrier configurations may be used. One additional wafer carrier configuration will now be described here in detail.

Figure 1A:
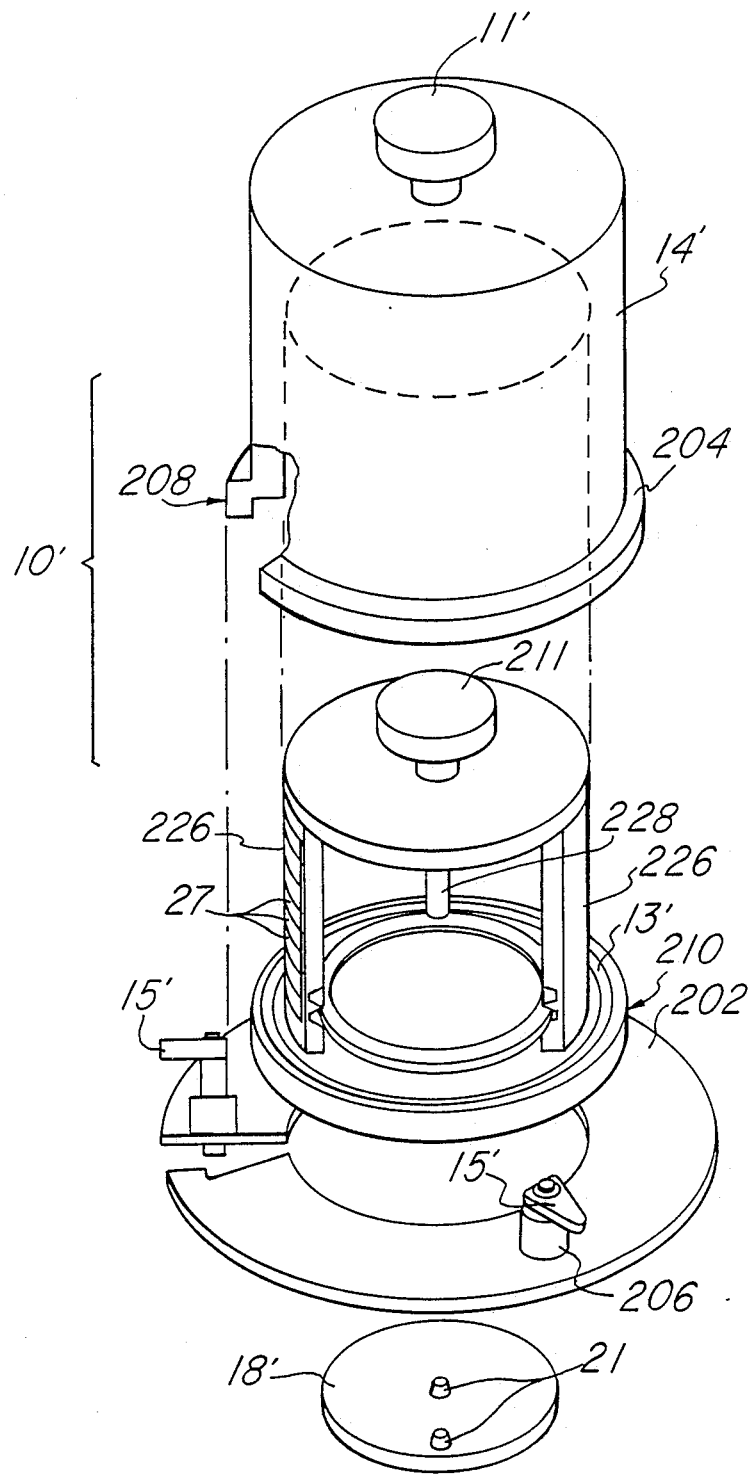

In this configuration, as shown in FIG. 1a, the wafer carrier 10 prime is configured so that, instead of having an openable sealed door 14, it has a liftable sealed cover 14 prime, which is joined to the body of the wafer carrier by a vacuum seal 13 prime. In this sample embodiment, a handle 11 prime is provided on the top of the cover 14 prime, for transporting assembly and removing the cover. Latches 15 prime, mounted on a base plate 202, are provided to engage a ledge 204 on the bottom of the cover and therefore make sure that the cover remains attached to the body of the carrier 10 prime, whether or not the seal 13 prime remains tight under vacuum. Thus, this added element of the plate 202 with the safety latches 15 prime on it permits utilization of the revised wafer carrier shape 10 prime. (This revised wafer carrier shape is closely similar to that used by one prior art system, namely that marketed by VG Systems.) That is, the embodiments shown in FIGS. 1a through 1e contain modifications to the basic wafer carrier normally used in certain prior art systems which permit such wafer carriers to be used in vacuum processing systems such as that disclosed in the parent application of the present application.

In the plate 202, note that the latches 15 prime include bosses 206 around their base which provide location to the periphery 208 of the boss 204 at the lower edge of the cover 14 prime.

In the sample embodiment, the platform 18 prime is modified to contain locating pins 21 such that one is on-axis with the generally cylindrical shape of the wafer carrier, and a second one is off-axis to provide control of the radial orientation of the wafer carrier.

Thus, in this embodiment, the latches 15 prime are released manually, and the sealed carrier assembly 10 prime is placed on the platform 18 prime manually. The load lock lid is closed, and, after the load lock has been pumped down so that the vacuum seal 13 prime releases, the cover 11 prime can be separated from the body the body of the carrier, so that the wafers inside the body of the carrier 10 prime can be accessed via transfer arm 28, as described above.

Figure 1B:
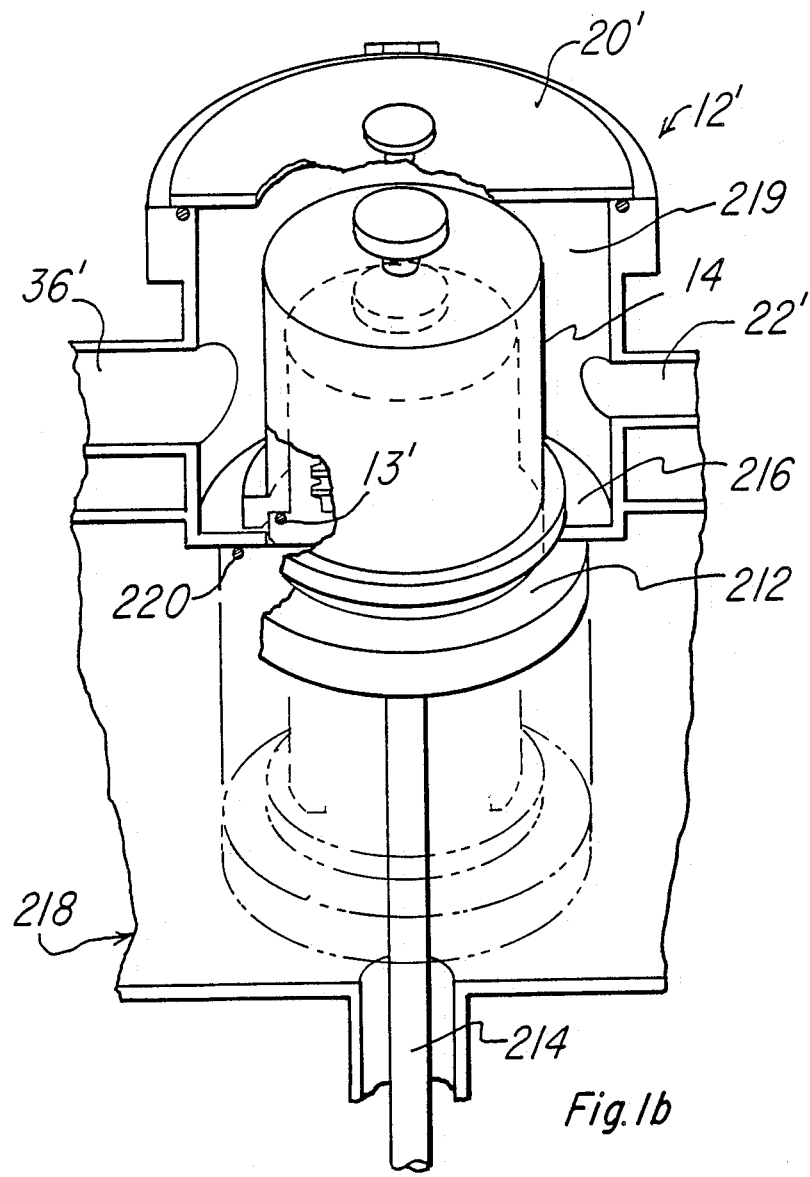
Figure 2:
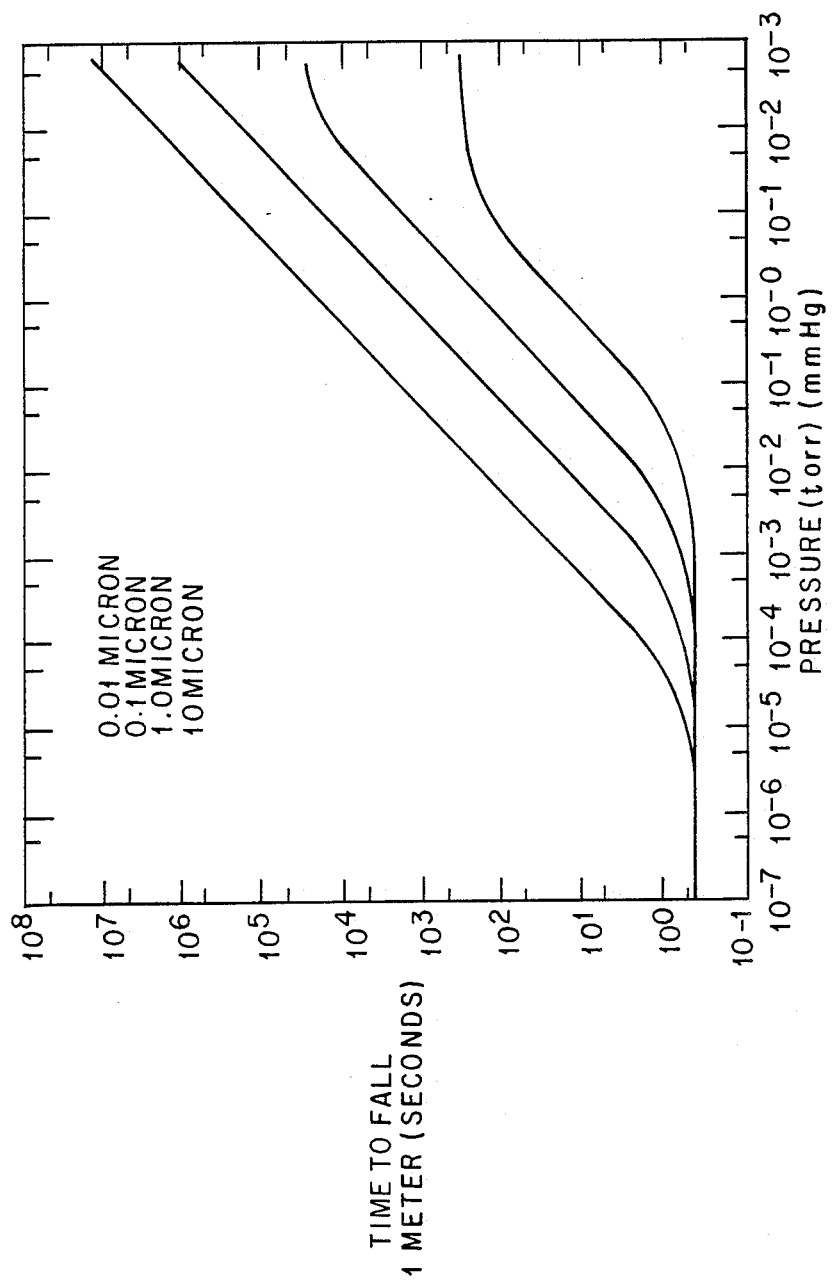
FIG. 2 shows a graph of the time required to fall through air at various pressures for various particulate sizes.

It would be possible to configure an arrangement so that the cover was raised from the body of the carrier; but more preferably, as shown in FIG. 1b, the body 210 of the wafer carrier 10 prime is initially supported on a stage 212 which supports the platform 18 prime. The stage 212 is then lowered, by mechanical transport element 214, so that the cover 14 prime remains supported by the upper floor 216 of the load lock 12 prime, while the body 210 is lowered into a lower chamber 218 of the load lock 12 prime.

In the preferred version of this embodiment, the base plate 202 and safety catches 15 prime are only used for transporting or storing the wafer carrier outside of the load lock chamber, and are manually removed from the base of the carrier 10 prime before it is placed into the load lock 12 prime. Thus, in this embodiment, the cover 14 prime of the wafer carrier 10 prime remains in place in the upper chamber 219 of the load lock, and provides a dirt barrier between the upper chamber 219, which is exposed to particulates when the cover 20 prime is opened, and the lower chamber 218. When the cover 14 prime is not in place, with a carrier body 210 in the lower chamber 218, the stage 212 itself will provide a dirt barrier against the lower surface of the partial floor 216. Moreover, a vacuum seal 220 is preferably provided, so that the upper chamber 219 can itself be used as the only load lock, and the lower chamber 218 kept under vacuum. This is not necessarily preferred, but it is an optional use of this embodiment. Moreover, this configuration does provide improved dirt isolation, since the upper chamber 219, which is most directly exposed to dirt, has relatively few and smooth surfaces in it, and it is therefore easier to blow particulates out. Thus, in this example the upper chamber 219 is connected not only to a vacuum port 36 prime, but also to a purge port 22 prime. After the upper chamber 219 is sealed and rough pumped down, purging gas can be blown through the port 22 prime. For example, it may be desirable to blow moist air or partially ionized clean gas through the port 22 prime to reduce electrostatic particulate clinging.

This alternative embodiment has the further advantage that the wafers themselves do not ever see even the surfaces in the load lock which were exposed to particulates during loading of the carrier into the lock. Thus, the wafer carrier body, and the wafers in it, not only never see dirty ambient atmosphere, they never even see surfaces which are exposed to dirty ambient atmosphere.

The effectiveness of this dirt seal between cover 14 prime and partial floor 216 can be further enhanced by adding an additional sealing element. For example, a vacuum O-ring can be inset into floor 216 surrounding the aperature where the carrier body will fit, to seal against a smooth surface on the underside of the flange of the cover. Less preferably, additional O-rings could be included in the carrier covers themselves.

Moreover, this O-ring, and the improved vacuum and dirt isolation which it provides, can be used to permit a further (alternative and optional) mode of operation. If the upper chamber is always isolated from the lower chamber by a vacuum seal—either the seal between the lower edge of a wafer carrier cover and the partial upper floor, or the seal between the elevatable stage and the partial upper floor—then the pressure and cleanliness of the upper chamber are not as critical. In some operations, where it is desired to improve throughput of the loading operation, it may be desirable not to pump down the upper chamber to the low pressures and particulate counts needed for actual wafer transfer. For example, in extreme versions of this the upper chamber could be used merely as an air shower chamber to remove gross particulates and provide an atmosphere comparable to a normal clean room. In other versions, where extremely high vacuum operations were desired to be performed (such as molcular beam epitaxy (MBE), which typically requires pressures of $10^{-10}$ Torr or less), the upper chamber could be used for rough pumping down to $10^{-5}$ Torr or so, to provide a reduced load on the ultra-high vacuum system of the lower chamber.

In this alternative embodiment of the wafer carrier, the wafer supporting ledges 60 are still used, but are now located in two side columns 226, which are opposite each other, as most clearly seen in the plan view of FIG. 1c, to provide line contact support of the wafer holder 224.

Note that, in this embodiment, wafer holders 224 are used, instead of unmounted wafers 48. This variation is not particularly advantageous, but simply provides a different embodiment of the present invention which is compatible with other existing processing equipment. FIG. 1e shows a detail view of how the wafer 48 is held fixedly by an expanding spring 227 in the wafer holder 224. In any case, whether bare wafers or wafer carriers are used, reduced contact area with the wafer is desirable to prevent generation of particulates, as discussed in the parent application and above. Thus, the ledges 60 which support the sides of the wafers 48 (or wafer holders 224) are preferably tapered, for the reasons discussed in the parent application.

In the specific embodiment using wafer holders 224, the wafer holders 224 have a notch 229 which engages the back support rod 228. This notch serves the purpose of assuring location of the wafer radially; in other words, it now serves the same function as the flat back surface of the wafer carrier 10 pressing against the flat of the wafer 48, if a bare wafer is used.

In this embodiment, note that the side support columns 226 and the back support rod 228 are joined at the top by a top support member 211 (which includes a handle extension), which provides mechanical rigidity and permits manipulation of the exposed wafer carrier body 210.

In this embodiment, the springs 27, which prevent rattling of the wafers during transport, are now located in the side support columns 226 as springs 27 prime, rather than being located in the door 14 as previously. This now means that more force may be required to remove and replace the wafers in the carrier, so it may be desirable to make the pins on the transfer arm 28 higher, to ensure that this additional force can be applied without the wafer slipping off the pins.

As will be appreciated by those skilled in the art, the present invention can be widely modified and varied, and its scope is not limited except as specified in the allowed claims.

What is claimed is:

1. A method of fabricating integrated circuits, comprising the steps of:
   performing desired process steps at plural respective process stations separated by an ambient at substantially atmospheric pressure; and
   transporting partially fabricated integrated circuit wafers among said process stations to perform a predetermined sequence of processing steps on one of said wafers, said transporting step comprising the substep of:
   transporting said wafers under vacuum in a vacuum-tight carrier after said wafers have been transferred to said carrier after the processing steps have been carried out.

2. The method of claim 1, further comprising the step of:
   providing that said wafers are oriented face-down.

3. The method of claim 1 wherein said wafers are oriented to reduce particulate contamination of the face to be processed.

4. A method of fabricating integrated circuits, comprising the steps of:
performing desired process steps on a wafer at a first process station and then at a second process station, wherein the first and second process stations are separated by an ambient at substantially atmospheric pressure; and
transporting said wafer under vacuum in a vacuum-tight carrier, from said first process station to said second process station after said wafers have been transferred to said carrier after the processing steps have been carried out.

5. The method of claim 4, including the step of:
transferring said wafer from said first process station to said vacuum-tight carrier, by first placing said carrier into a vacuum environment in a first load lock and then transferring said wafer into said carrier, under vacuum, wherein said first load lock is in vacuum-tight communications with said first process station.

6. The method of claim 4, including the step of:
transferring said wafer from said vacuum-tight wafer carrier to said second process station, by first placing said carrier into a vacuum environment in a second load lock and then transferring said wafer from said carrier to said second process station, under vacuum, wherein said second load lock is in vacuum-tight communication with said second process station.

7. The method of claim 6, further comprising the step of:
providing that said wafer is oriented face-down.

8. The method of claim 4, wherein said vacuum is a hard vacuum.

9. The method of claim 8 wherein the hard vacuum is of a pressure sufficiently low so that there is insufficient Brownian motion to support particles of less than 10 nanometers.

10. The method of claim 4 wherein the vacuum is of a pressure sufficiently low so that there is insufficient Brownian motion to support particles of less than 10 nanometers.

11. The method of claim 4 wherein said wafer is oriented to reduce particulate contamination of the face to be processed.

12. A method of fabricating integrated circuits, comprising the steps of:
transporting a wafer under vacuum in a vacuum-tight carrier through an ambient at substantially atmospheric pressure;
inserting said carrier into a vacuum load lock;
transferring said wafer under vacuum from said carrier to one of a plurality of process stations; and
performing a predetermined sequence of process steps on said wafer at said process station and then transferring the wafer back to the carrier for further transport.

13. The method of claim 12, wherein said wafer is transferred from said carrier to said process station, by a wafer transfer arm.

14. The method of claim 12, further comprising the step of:
providing that said wafer is oriented face-down.

15. The method of claim 12 wherein said wafer is oriented to reduce particulate contamination of the face to be processed.

16. A method of semiconductor wafer processing, comprising the steps of:
carrying out one or more processing steps on one or more wafers at one or more processing stations opening onto a common vacuum environment in a first processing module;
transferring said one or more wafers under vacuum to a vacuum-tight carrier;
transporting said vacuum-tight carrier through an ambient at substantially atmospheric pressure, to a second processing module;
transferring said one or more wafers from said carrier under vacuum to one or more processing stations opening onto a common vacuum environment in said second processing module and then transferring the wafer back to the carrier for further transport.

17. The method of claim 16, including the step of providing that each of said vacuums is a hard vacuum.

18. The method of claim 17 wherein the vacuum is of a pressure sufficiently low so that there is insufficient Brownian motion to support particles of less than 10 nanometers.

19. The method of claim 16, wherein said step of transferring said one or more wafers to said vacuum-tight carrier, is carried out with a first module wafer transfer arm.

20. The method of claim 16, wherein said step of transferring said one or more wafers from said vacuum tight carrier, is carried out with a second module wafer transfer arm.

21. The method of claim 16, further comprising the step of;
providing that said one or more wafers are oriented face-down to reduce particular contamination of the face.

22. The method of claim 16 wherein the hard vacuum is of a pressure sufficiently low so that there is insufficient Brownian motion to support particles of less than 10 nanometers.

23. The method of claim 16 wherein said wafer is oriented to reduce particulate contamination of the face to be processed.

24. A method of fabricating integrated circuits, comprising the steps of:
transporting a wafer under vacuum in a vacuum-tight carrier through an ambient at substantially atmospheric pressure;
inserting said carrier into a vacuum load lock;
transferring said wafer under vacuum from said carrier to a wafer processing station; and
carrying out a predetermined sequence of process steps on said wafer at said process station and then transferring the wafer back to the carrier for further transport.

25. The method of claim 24, further comprising the step of:
providing that said wafer is oriented face-down.

26. The method of claim 24 wherein said wafer is oriented to reduce particulate contamination of the face to be processed.

27. A method of processing semiconductor wafers, comprising the steps of:
transporting a plurality of wafers under vacuum in a face-down orientation in a vacuum-tight carrier through an ambient at substantially atmospheric pressure;

inserting said carrier into a vacuum load lock;

transferring one of said wafers, face-down under vacuum from said carrier to a wafer processing station; and carrying out a predetermined sequence of process steps on said wafer at said process station and then transferring the wafer back to the carrier for further transport.

28. The method of claim 27, wherein said process steps are carried out with said wafer in a face-down orientation.

29. The method of claim 28, further comprising the steps of:

providing that each of said vacuums in a hard vacuum.

30. The method of claim 29 wherein the hard vacuum is of a pressure sufficiently low so that there is insufficient Brownian motion to support particles of less than 10 nanometers.

31. The method of claim 27 wherein the vacuum is of a pressure sufficiently low so that there is insufficient Brownian motion to support particles of less than 10 nanometers.

32. The method of claim 27 wherein said wafer is oriented to reduce particulate contamination of the face to be processed.

33. A method of processing semiconductor wafers, comprising the steps of:

transporting a plurality of wafers under vacuum in a face-down orientation on a vacuum-tight carrier through an ambient at substantially atmospheric pressure;

inserting said carrier into a vacuum load lock;

transferring said wafers one-at-a-time face-down under vacuum from said carrier to one of a plurality of process stations; and performing a predetermined sequence of process steps on said wafers at said process station and then transferring the wafer back to the carrier for further transport.

34. The method of claim 33, wherein said process steps are carried out with said wafers in a face-down orientation.

35. The method of claim 34, further comprising the steps of:

providing that each of said vacuums in a hard vacuum.

36. The method of claim 35 wherein the hard vacuum is of a pressure sufficiently low so that there is insufficient Brownian motion to support particles of less than 10 nanometers.

37. The method of claim 33 wherein the vacuum is of a pressure sufficiently low so that there is insufficient Brownian motion to support particles of less than 10 nanometers.

38. The method of claim 33 wherein said wafer is oriented to reduce particulate contamination of the face to be processed.

39. A semiconductor wafer processing method, comprising the steps of:

providing a plurality of process stations separated by an ambient at substantially atmospheric pressure;

providing a vacuum-tight carrier;

transporting semiconductor wafers among said process stations in said carrier;

carrying out a predetemined sequence of process steps on said wafers at said process stations and then transferring the wafer back to the carrier for further transport.

40. The method of claim 39, further comprising the step of:

providing at least one load lock associated with and in vacuum-tight communication with each of said process stations, in which to place said carrier to transfer wafers to and from said associated process station.

41. The method of claim 40, further comprising the steps of:

providing a hard vacuum in said carrier and in said load locks.

42. A semiconductor wafer processing method, comprising the steps of:

providing a plurality of process modules separated by an ambient at substantially atmospheric pressure;

providing a vacuum environment within each of said modules;

providing at least one process station associated with each of said modules and in vacuum-tight communication with the vacuum environment of that module;

providing a vacuum-tight carrier;

transporting semiconductor wafers among selected process modules, in said carrier, to carry out a predetermined sequence of process steps upon said transported wafers at selected ones of said process stations and then transferring the wafer back to the carrier for further transport.

43. The method of claim 42, further comprising the steps of:

providing at least one vacuum load lock associated with and in vacuum-tight communication with each of said process modules;

using said load locks to receive said carrier to effect vacuum transfer of said wafers to and from said process stations.

44. The method of claim 43, further comprising the steps of:

providing a hard vacuum in said carrier, said load lock and said module vacuum environments.

45. The method of claim 44 wherein the hard vacuum is of a pressure sufficiently low so that there is insufficient Brownian motion to support particles of less than 10 nanometers.

46. The method of claim 42 wherein the vacuum is of a pressure sufficiently low so that there is insufficient Brownian motion to support particles of less than 10 nanometers.

* * * * *